United States Patent
Takahashi

(10) Patent No.: US 8,193,644 B2
(45) Date of Patent: Jun. 5, 2012

(54) POP PRECURSOR WITH INTERPOSER FOR TOP PACKAGE BOND PAD PITCH COMPENSATION

(75) Inventor: Yoshimi Takahashi, Beppu (JP)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 13/219,878

(22) Filed: Aug. 29, 2011

(65) Prior Publication Data

US 2011/0309523 A1    Dec. 22, 2011

Related U.S. Application Data

(62) Division of application No. 12/509,012, filed on Jul. 24, 2009, now Pat. No. 8,034,660.

(51) Int. Cl.
*H01L 23/48* (2006.01)
(52) U.S. Cl. ............. 257/774; 257/686; 257/E23.001
(58) Field of Classification Search .......... 257/774, 257/E23.011, 686
See application file for complete search history.

(56) References Cited

U.S. PATENT DOCUMENTS 7,198,980 B2 *   4/2007   Jiang et al. ............... 438/107

* cited by examiner

*Primary Examiner* — Roy Potter
(74) *Attorney, Agent, or Firm* — Steven A. Shaw; W. James Brady; Frederick J. Telecky, Jr.

(57) ABSTRACT

An electronic assembly adapted for forming package on package (PoP) devices includes a package substrate having a molded IC die thereon that defines a mold cap height and substrate contact pads lateral to the molded IC die. An interposer including an interposer substrate has bottom metal land pads and top metal land pads, interposer vias, and an open receptacle region formed through the interposer substrate. The substrate top surface is positioned relative to the interposer so that the molded IC die is within the open receptacle region to align the bottom metal land pads and substrate contact pads. An underfill layer is between the substrate top surface and the bottom side of the interposer substrate. A step height from the mold cap height minus a height of the top metal land pads is generally from 0 to 0.2 mm.

11 Claims, 8 Drawing Sheets

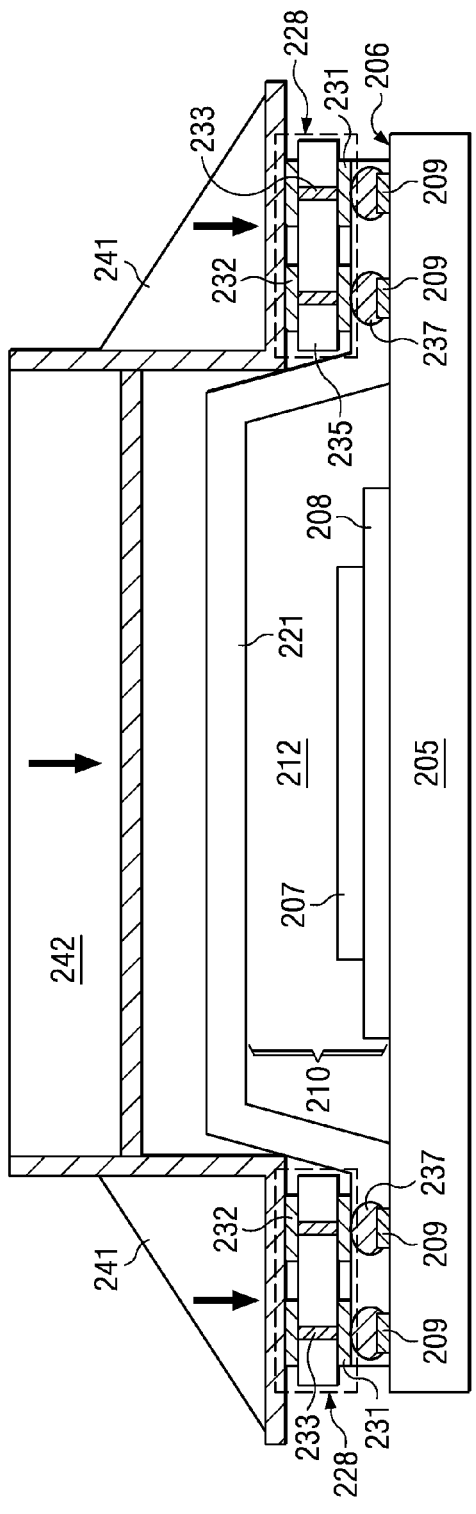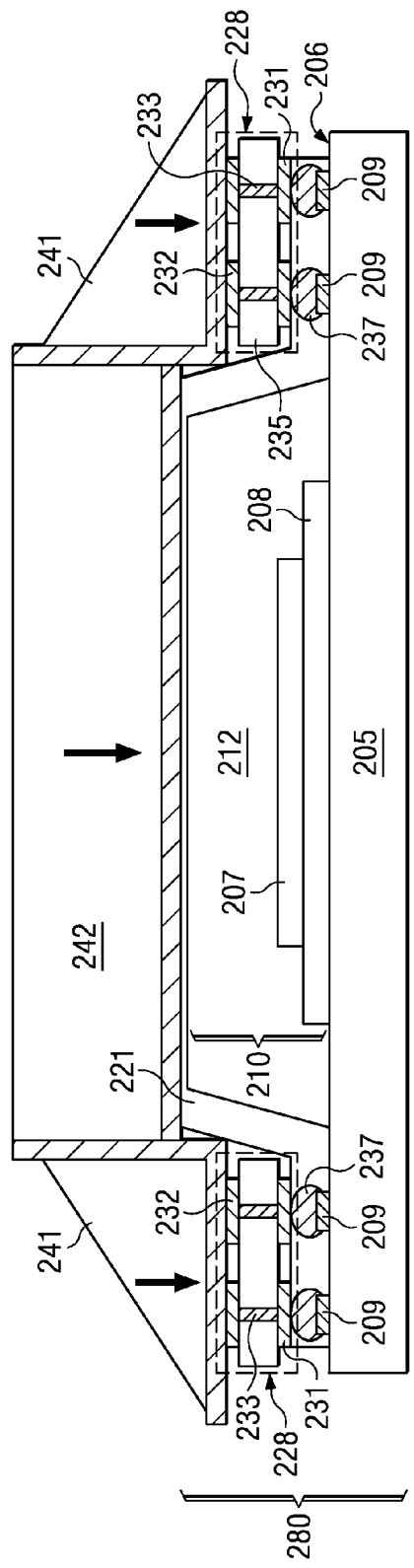
FIG. 2E
FIG. 2F

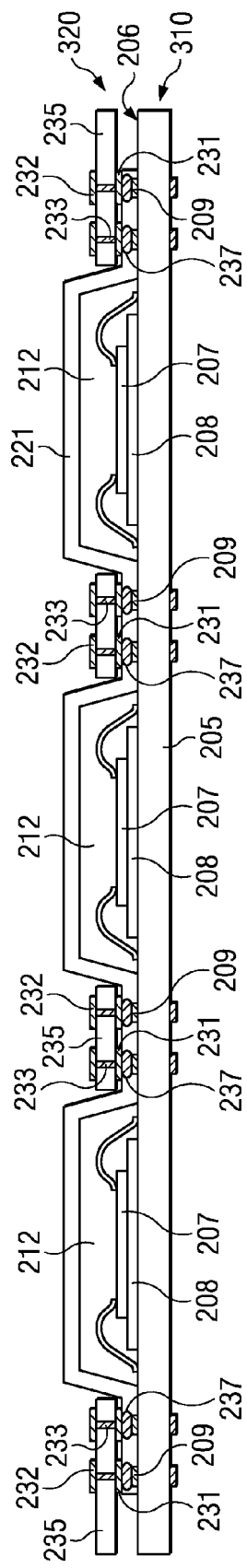
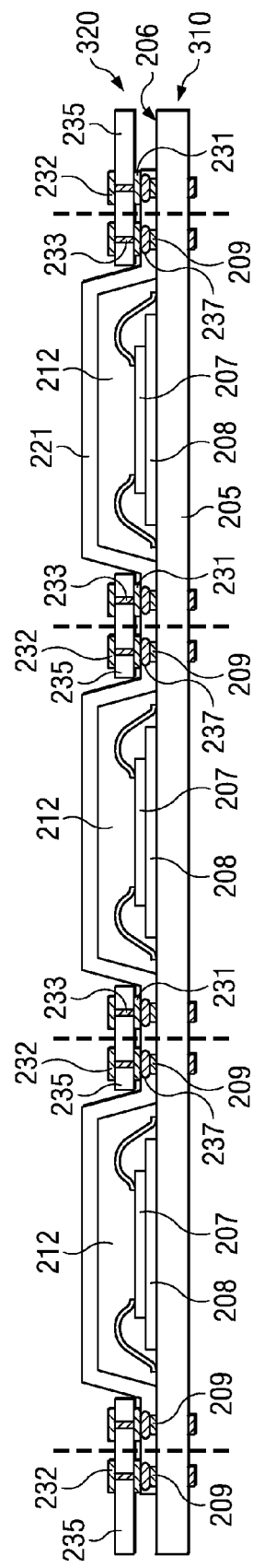

POP PRECURSOR WITH INTERPOSER FOR TOP PACKAGE BOND PAD PITCH COMPENSATION

This is a divisional of application Ser. No. 12/509,012 filed Jul. 24, 2009, the contents of which are herein incorporated by reference in its entirety.

FIELD OF THE INVENTION

Disclosed embodiments generally relate to integrated circuit (IC) assembly manufacturing, and more particularly to Package-on-Package (PoP) precursors and PoP devices therefrom, and related assembly processes and electronic assemblies.

BACKGROUND

PoP is an IC packaging technique that involves vertically stacking two or more electronic packages on one another. One recognized advantage of PoP is less board space. POP is a conventional packaging solution for applications that require more features in a minimum of space, such as digital cameras, PDA's, MP3 players, and mobile gaming devices. POP assemblies usually comprise two electronic packages, such as one or more memory devices in a first package mounted on top of a logic device in a second package.

In some arrangements the bottom or base package may employ die stacking, such as for example, to allow the combination of analog functionality or flash memory to the logic chip. The base package in such arrangements is generally a molded substrate comprising two or more stacked IC die having overmolding covering the IC die(s). In this arrangement, the portions of the base package lateral to the molded die(s) include exposed land pads (i.e. without molding). Since the IC die thickness is generally 75 to 100 µm, the overmold height for the PoP molded substrate is generally at least 150 µm.

As known in the art, as the pitch of the land pads decreases, the size of the solder balls (which are generally spherical) must also decrease to avoid the solder balls shorting together adjacent land pads. Accordingly, when bonding a fine pitched packaged IC on top of a molded substrate, the maximum solder ball size used to connect the packaged IC to the exposed land pads of the package substrate is limited by the pitch of the packaged IC to be mounted. A problem is thus presented when the maximum solder ball size becomes too short to reach the pads on the bottom package substrate located lateral to the molded IC die (or die stack).

Particularly when the bottom package has a large overmold height, such as at least 150 µm, and the packaged IC to be mounted has a fine-pitched land pads, such as memory die having $\leq$0.4 mm pitched (mmp) land pads, this problem has to be addressed. Known processes for addressing this problem include deep cavity substrates, through mold vias (TMVs), and molded core embedded packages (MCEPs). Cavity substrates are known to be expensive because of many bonded (e.g., glued) layers and multilayer metal, and are also known to have quality control difficulties. Difficulties for quality control of cavity substrates include challenges associated with deep via etching, via bottom cleaning, and alignment accuracy on layer lamination. TMV and MCEP are known to be relatively complex and are thus both relatively expensive assembly processes. Moreover, none of these processes can generally support PoP arrangements when the top packaged has fine-pitched land pads (e.g., 0.4 mmp or 0.5 mmp).

SUMMARY

Embodiments described herein include methods for forming electronic assemblies which function as PoP precursors that include interposers having a tunable interposer thickness. The interposer thickness can be set by the height of the solder ball (or other bonding conductor, e.g., stud) used to mount a top packaged IC on the electronic assembly. The Inventor has discovered that by allowing the interposer thickness to become an assembly design variable, the height of the top metal land pads on the interposer top surface can be set to be anywhere desired. For example, in one described arrangement, the interposer height is set so that the height of the solder ball (or other bonding conductor) used to bond the packaged IC on top of the mold cap is substantially equal to the difference between the mold cap height and the height of the top metal land pads on the interposer top surface.

Using a tunable interposer thickness, conventional package substrates (e.g., conventional planar printed circuit boards (PCBs)) can be used, and the processing is generally simplified and/or assembly costs reduced. Moreover, the overall thickness of the PoP formed after mounting the top packaged IC on the electronic assembly can be reduced. Significantly, embodiments of the invention are capable of bonding a top packaged IC having fine-pitched land pads, such as $\leq$0.5 mmp, $\leq$0.4 mmp or $\leq$0.3 mmp to a molded electronic assembly comprising a conventional planar package substrate.

Accordingly, unlike known assembly techniques for addressing the problem imposed by top packages having fine pitched land pads to be mounted on a bottom package substrate comprising a molded thick IC die (e.g., >150 µm) or IC die stack thereon, such as deep cavity substrates, TMVs, and MCEPs described above, embodiments of the invention can generally utilize conventional low cost package substrates, and involve relatively simple processing.

In one disclosed embodiment, a substrate interposer having an open receptacle region is positioned onto a bottom package substrate having a molded thick IC die or a molded IC die stack thereon so that the molded thick IC die or a molded IC die stack fits within the receptacle region. The interposer thickness can be selected so that the height of the top metal land pads on the interposer top surface is at a level that is lower or nearly planar relative to the mold cap height. In one embodiment the interposer top surface is lower than the mold cap height by a distance that approaches but is somewhat less than the height of the solder ball or other conductor used for connecting the packaged IC die to the top metal land pads on the interposer top surface (e.g. 0.01 to 0.2 mm). The pitch of the top metal land pads of the interposer can match the land pad pitch of the packaged IC to be bonded thereon, and the bottom land pads on the bottom of the interposer can match the land pattern on the bottom of the package substrate. Heat pressing is then generally used for obtaining bonding to form the electronic assembly.

Another aspect of embodiments of the invention involves use of a curable dielectric film (CDF) that is placed between the interposer and the bottom package substrate. The pressing force during heat pressing results in the interposer penetrating into the CDF layer to form metallic joints between the bottom metal land pads on the bottom of the interposer and the substrate contact pads, and the CDF forming an underfill layer. Accordingly, conventional capillary underfill is not needed.

BRIEF DESCRIPTION OF THE DRAWINGS

FIG. 2A-F shows successive cross sectional depictions associated with an assembly process flow for forming an electronic assembly adapted for bonding a top packaged IC die thereon to form a PoP device, according to an embodiment of the invention.

FIG. 3A-E shows depictions of an exemplary strip-to-strip assembly process flow for forming electronic assemblies adapted for bonding a top packaged IC thereon to form a PoP device, according to an embodiment of the invention.

FIG. 4A depicts an exemplary top package shown as a memory package exploded from an electronic assembly adapted for bonding a top packaged IC die thereon to form a PoP device, while

DETAILED DESCRIPTION

Figure 1:
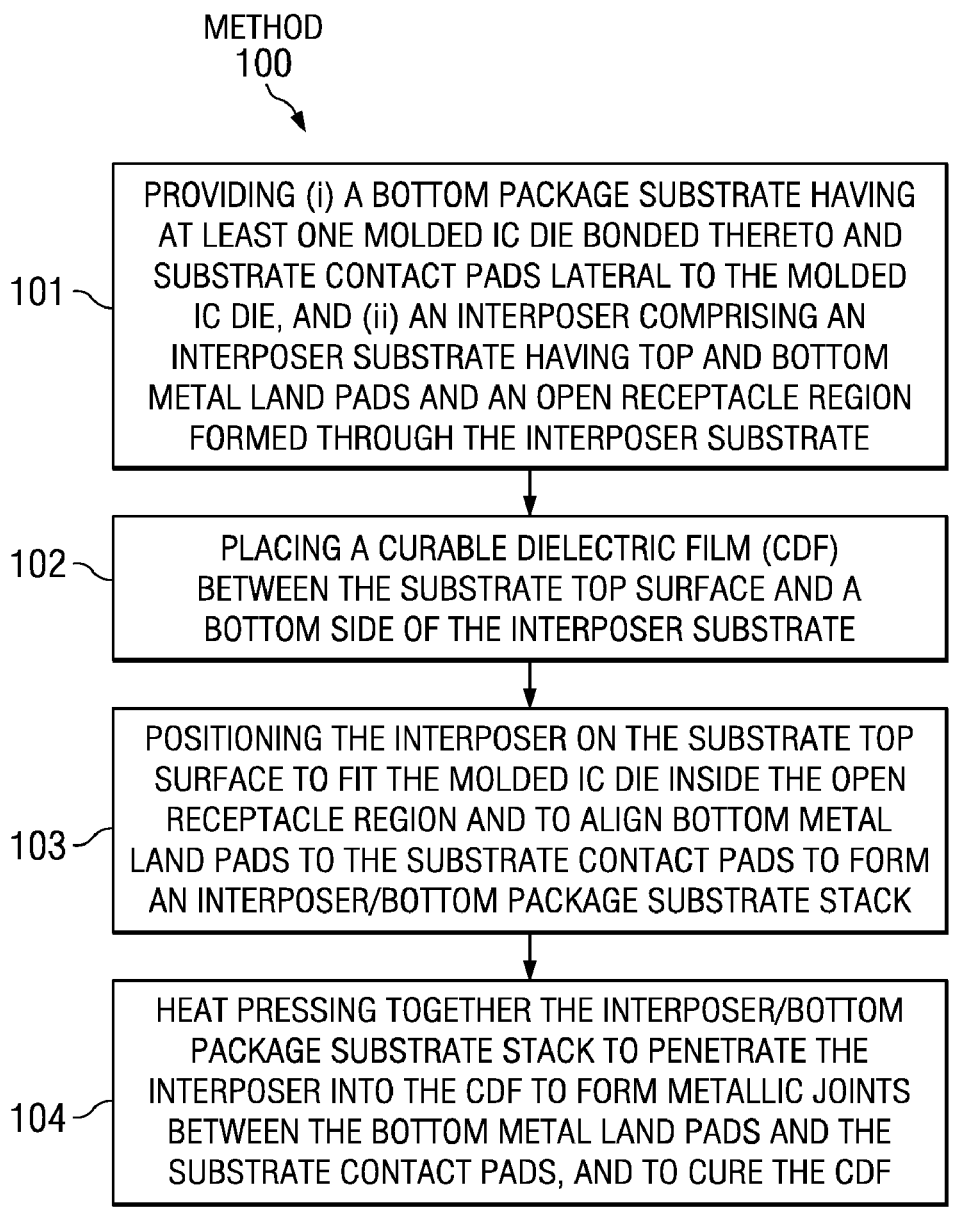
FIG. 1 shows steps in a method of forming an electronic assembly adapted for bonding a top packaged IC thereon to form a PoP device, according to an embodiment of the invention.

Embodiments of the invention are described with reference to the attached figures, wherein like reference numerals are used throughout the figures to designate similar or equivalent elements. The figures are not drawn to scale and they are provided merely to illustrate the instant invention. Several aspects of the invention are described below with reference to example applications for illustration. It should be understood that numerous specific details, relationships, and methods are set forth to provide a full understanding of the invention. One having ordinary skill in the relevant art, however, will readily recognize that the invention can be practiced without one or more of the specific details or with other methods. In other instances, well-known structures or operations are not shown in detail to avoid obscuring the invention. Embodiments of the invention are not limited by the illustrated ordering of acts or events, as some acts may occur in different orders and/or concurrently with other acts or events. Furthermore, not all illustrated acts or events are required to implement a methodology in accordance with embodiments of the invention.

Referring to FIG. 1, a method 100 of forming an electronic assembly adapted for bonding a top packaged IC thereon to form a PoP device is shown. Step 101 comprises providing (i) a bottom package substrate comprising a substrate top surface having at least one molded IC die bonded thereto, wherein the molded IC die defines a mold cap height. The substrate top surface has substrate contact pads lateral to the molded IC die. An (ii) interposer is also provided comprising an interposer substrate having bottom metal land pads on a bottom side of the interposer substrate and top metal land pads on a top side of the interposer substrate, interposer vias for connecting the top metal land pads to the bottom metal land pads, and an open receptacle region formed through the interposer substrate.

The interposer substrate generally comprises a polymer, such as a polyimide tape having metal integrated between top side and bottom side using via conventional connections. However, other suitable interposer substrate materials may include FR-4 resin, BT resin, some ceramics and even some semiconductor materials (e.g., Si) provided at least some surfaces are lined with a dielectric material to prevent shorting of the various electrical circuits running thereacross. The interposer substrate may have a laminated structure comprising sublayers, or plies. The interposer has a total interposer thickness which comprises the sum of the solder masks, core, prepreg, and metal pads.

As noted above, the total interposer thickness can be selected so that the height of the top metal land pads is at a level that is lower or nearly planar as compared to the mold cap height. In one embodiment the interposer top surface is lower than the mold cap height by a distance that approaches but is somewhat less than the height of the solder ball or other conductor used for connecting the packaged IC die to the top metal land pads on the interposer top surface. The total interposer thickness is generally selected to create a step height comprising the mold cap height minus (−) a height of the top metal land pads on the interposer substrate of between −0.1 and 0.2 mm, and in one embodiment is between 0 to 0.2 mm.

The molded IC die or dies can generally be in any arrangement, in some cases include bond wires, in some case be without bond wires, and be face up (e.g. with TSV), face down, or for stacked die arrangements have one die face up (e.g. bottom die) and one die face down (e.g. flip-chip assembled top die).

In step 102, a CDF is placed between the substrate top surface and the bottom side of the interposer substrate. In one embodiment, the CDF material prior to curing provides a low melt viscosity, such as lower than 500 to 1,000 pascal-second (Pa·s), and fast curability, such as a 30 second cure time for a temperature of at least 180° C. The CDF can include an optional filler, with the wt. % of the filler based on matching the coefficient of thermal expansion (CTE) of the CDF to the CTE of the lamination area surface (i.e. substrate top surface). The thickness of the CDF is generally calculated to fill the area between the substrate and the area around the mold, for example, about 40 µm in one embodiment. The CDF material can include flux. As known in the art, a flux refers to a chemically- or physically-active formulation capable of cleaning oxides and enabling wetting of metals (e.g., copper) with solder. Flux is generally included in the CDF when the bonding conductors include highly oxidizable metals, such as copper.

In step 103 the interposer is positioned on the substrate top surface to fit the molded IC die inside the open receptacle region and to align the bottom metal land pads to the substrate contact pads to form an interposer/bottom package substrate stack. Step 104 comprises heat pressing together the interposer/bottom package substrate stack to penetrate the interposer into the CDF to form metallic joints between the bottom metal land pads and the substrate contact pads, and to cure the CDF. As described above, the CDF forming an underfill layer means conventional capillary underfill is not needed. Typical heat pressing conditions for pressing the interposer comprise a temperature of 150-180° C., force/area (pressure) during pressing of 35-133 Kgf/cm$^2$, and a pressing time between 100-180 sec.

Figure 2A:
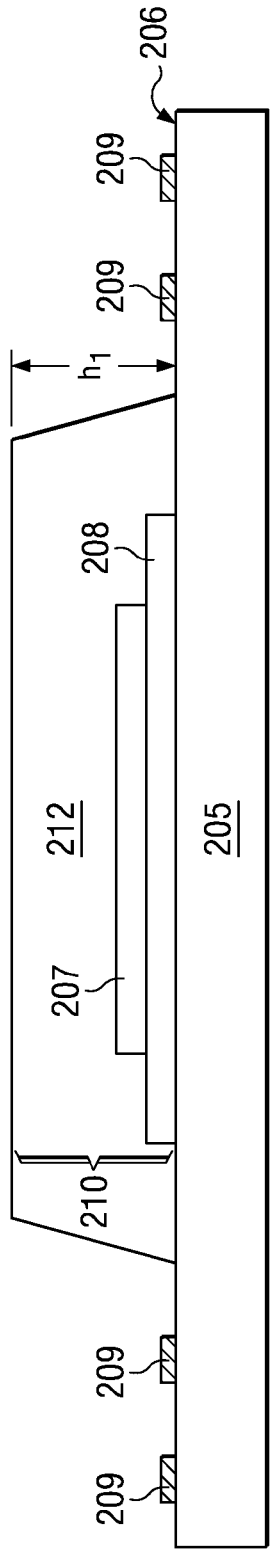

FIGS. 2A-F shows successive cross sectional depictions associated with an assembly process flow for forming an electronic assembly adapted for bonding a top packaged IC thereon to form a PoP device, according to an embodiment of the invention. FIG. 2A shows a bottom package substrate 205 comprising a substrate top surface 206 having a IC die stack comprising a first (top) 207 and a second (bottom) IC die 208 bonded thereto having an encapsulant/molding layer 212 thereon, referred to herein as a "molded IC die" 210. The bottom package substrate 205 can be seen to be a substantially planar substrate, such as a conventional laminate PCB. The molded IC die 210 defines a mold cap height, shown as $h_1$, and the substrate top surface 206 has substrate contact pads 209 located lateral to the molded IC die 210.

Figure 2B:
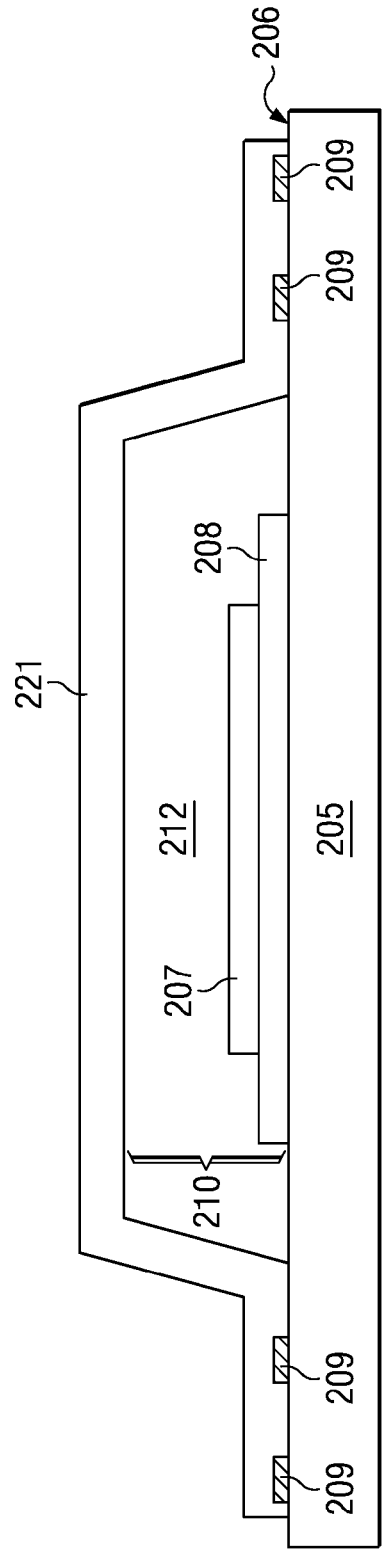

FIG. 2B shows a cross sectional depiction following lamination of a CDF 221 to the molded IC die substrate 210 and substrate contact pads 209. The lamination process is generally performed at a vacuum level corresponding to a pressure <1 kPa (approximately <7.5 ton), and at a temperature high enough to provide tackiness to the CDF. As known in the art of vacuum technology, a rough vacuum is generally regarded as a pressure from 760 Torr to 1 Torr, and a medium vacuum a pressure from 1 Torr to $10^{-3}$ Torr. A <1 kPa vacuum for the CDF lamination has been found to generally remove most of the air remaining in CDF, as well as the air in and around the CDF. Significantly, the Inventor has found that if such vacuum processing is not used for the CDF lamination, the CDF upon subsequent curing generally undesirably tends to have a high concentration of voids and/or large voids.

The temperature to provide tackiness to the CDF is dependent on the particular CDF composition and can be based on the lowest melt viscosity temperature of the CDF, which is generally a resin. The temperature to provide tackiness is typically between at least 60° C. and a temperature of minimum melting viscosity for the CDF.

Figure 2C:
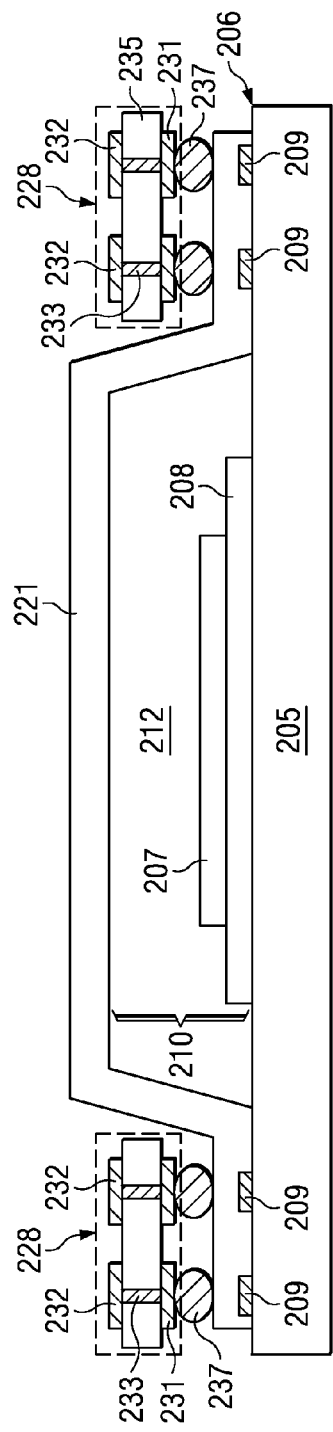

FIG. 2C shows a cross sectional depiction following lamination of an interposer 228 to the molded substrate having CDF thereon. The laminated structure can be set on a mold die. The interposer 228 comprises an interposer substrate 235 having bottom metal land pads 231 on a bottom side of the interposer substrate and top metal land pads 232 on a top side of the interposer substrate, and interposer vias 233 for connecting the top metal land pads 232 to the bottom metal land pads 231, and an open receptacle region formed through the interposer substrate (where molded IC die 210 is fit). Bottom metal land pads 231 are shown connected to solder balls 237.

Figure 2D:
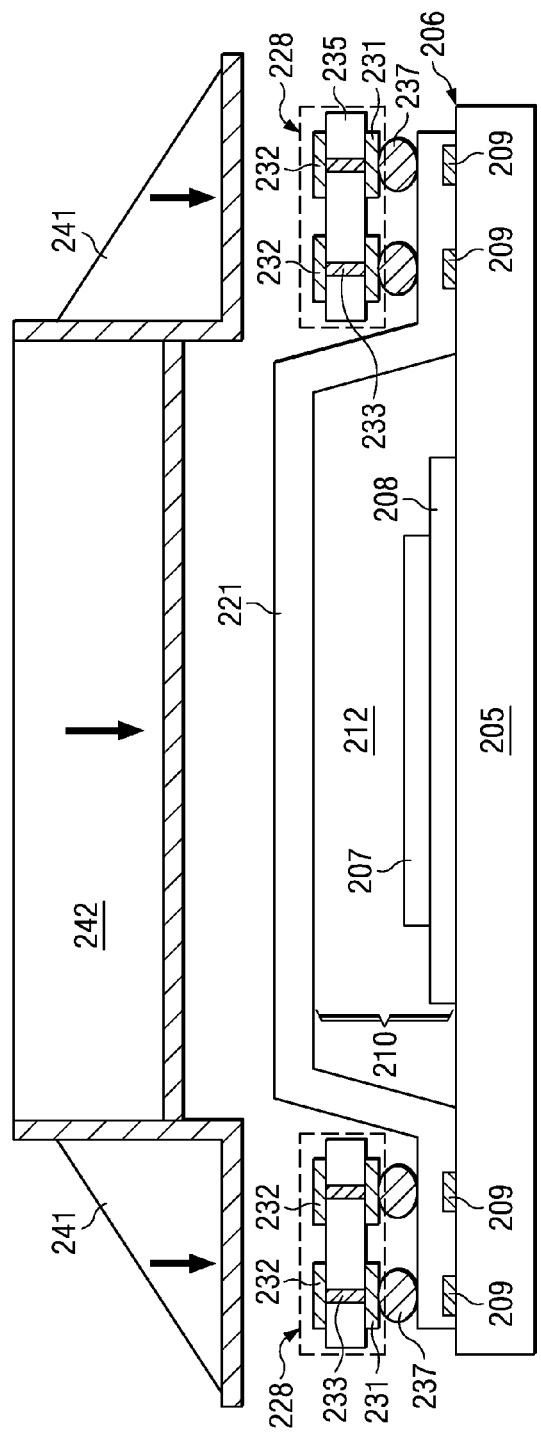

FIG. 2D shows a cross sectional depiction of the interposer 228 laminated to the substrate 205 having the molded IC 210 thereon having a CDF 221 thereon placed in a pressing system. The pressing can be implemented using a pressing system comprising an independently movable first pressing head 241 and second pressing head 242, which provides and a maximum temperature during heat pressing to cure the CDF of ≧160° C., which is generally ≧180° C. Independently movable pressing heads allows the force/area applied by the respective heads to be different. In one embodiment, the force/area applied by the first pressing head to the interposer is greater than a force/area applied by the second pressing head to the molded IC. A vacuum level corresponding to a pressure <1 kPa (approximately <7.5 torr) is generally applied before pressing.

The pressing system having independently movable pressing heads 241 and 242 is not a conventional clam-shell based pressing system, but is rather a system comprising a vertically moveable upper die tool and a generally fixed lower die tool which is thus capable of imparting almost exclusively vertical pressure. One exemplary pressing system design is based on a Cavity Direct Injection Molding (CDIM) tool. One vendor for a CDIM tool is Apic Yamada (Apic Yamada Corporation, 90 Kamitokuma, Chikuma-shi, Nagano-ken, Japan). The CDIM tool is described by Apic Yamada for ejecting liquid resin on a circuit board and the top mold presses on the cavity of the chips while heating sufficiently to solidify the resin. The CDIM includes a vacuum system. Unlike conventional transfer molding, the CDIM method also uses little horizontal pressure due to springs above the pressing die (heads) and a generally fixed location support block (i.e. lower die tool) below the substrate. Embodiments of the invention as described below make a new pressing/metallic bonding use of a CDIM tool design. Moreover, as described below, modifications to the CDIM tool can be made to further improve the performance of the pressing tool for metallic bonding including reduced die slippage particularly for edge IC die (as opposed to center IC die).

FIG. 2E shows a cross sectional depiction of the first pressing head 241 clamping the interposer 228, with the second pressing head 242 not yet clamping the molded IC 210. The force/area applied by the first pressing head 241 is generally in a range from 35 to 133 Kgf/cm$^2$. A temperature during interposer clamping can be of ≧160° C., such as about 180° C. The solder balls 237 shown on the bottom of the interposer 228 can be seen have been pushed through the CDF 221 to reach the land pads 209 on the surface of the package substrate 205.

FIG. 2F shows a cross sectional depiction of the second pressing head 242 now clamping the molded IC die 210 while the first pressing head 241 continues to clamp the interposer 228. The force/area applied by the second pressing head 242 is generally in a range from 15 and 30 Kgf/cm$^2$. A temperature during molded substrate clamping can be of ≧160° C., such as about 180° C.

In a typical embodiment, the assembly comprises strip-to-strip assembly processing. In this embodiment, a molded package substrate strip comprising a plurality of molded package substrates and an interposer strip comprising a plurality of interposers are placed, positioned and heat pressed together.

Figure 3A:
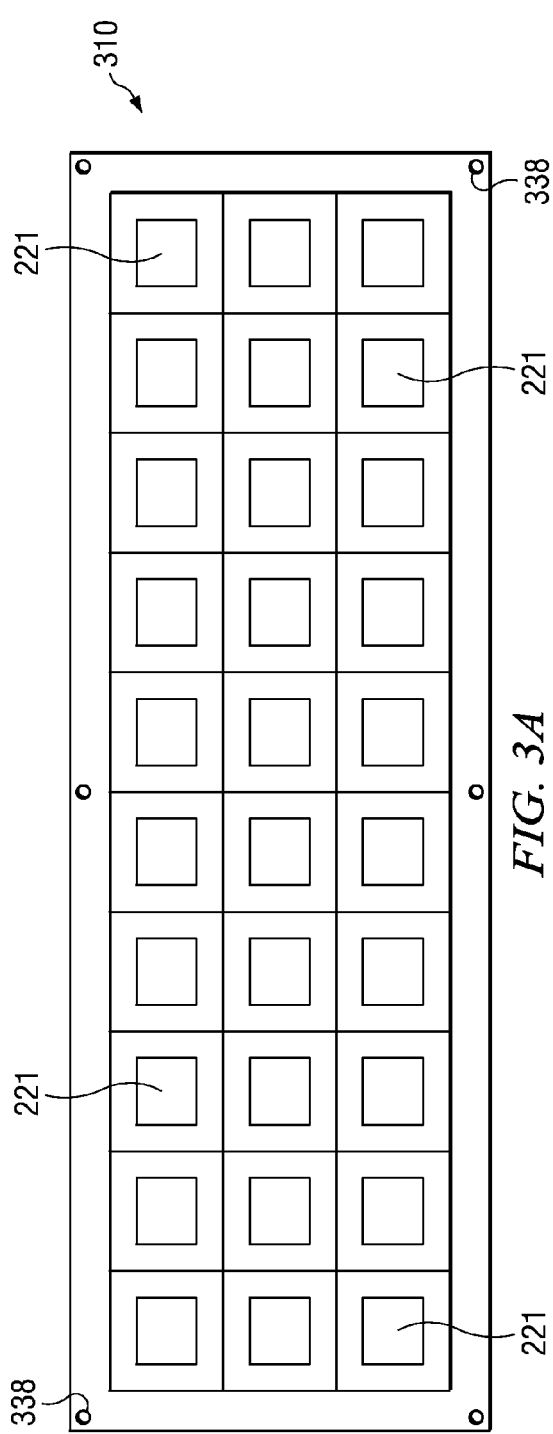
Figure 3B:
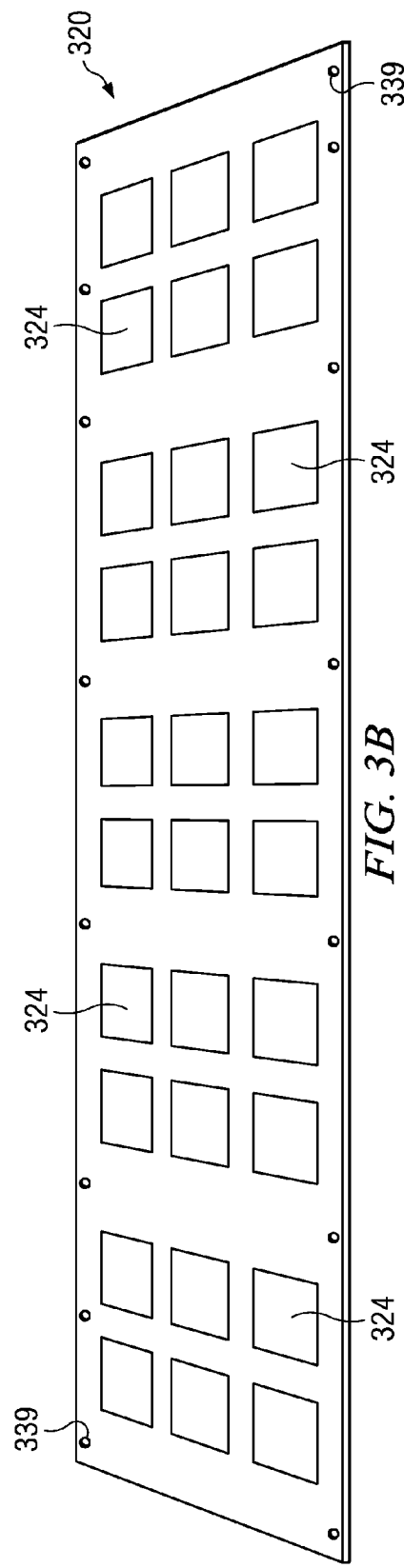

FIG. 3A-E show depictions of an exemplary strip-to-strip assembly processing flow for forming electronic assemblies adapted for bonding a top packaged IC die thereon to form a package on package (PoP) device according to an embodiment of the invention. FIG. 3A shows a strip/sheet 310 (hereafter molded substrate strip 310) comprising a plurality of molded substrates having CDF 221 laminated onto the molded area and the metal interconnect land area, wherein each device in the molded substrate strip 310 corresponds to the structure shown in FIG. 2B. FIG. 3B shows a strip/sheet 320 (hereafter interposer strip 320) comprising a plurality of interposers having bottom metal land pads on a bottom side of the interposer substrate and top metal land pads on a top side of the interposer substrate and interposer vias for connecting the top metal land pads to the bottom metal land pads, and an open receptacle regions 324 formed through the interposer substrate (refer to FIG. 2C for identification of these features). Punch out holes 338 and 339 can be seen in FIGS. 3A and 3B, respectively, which are used for alignment purposes as described below.

Figure 3C:
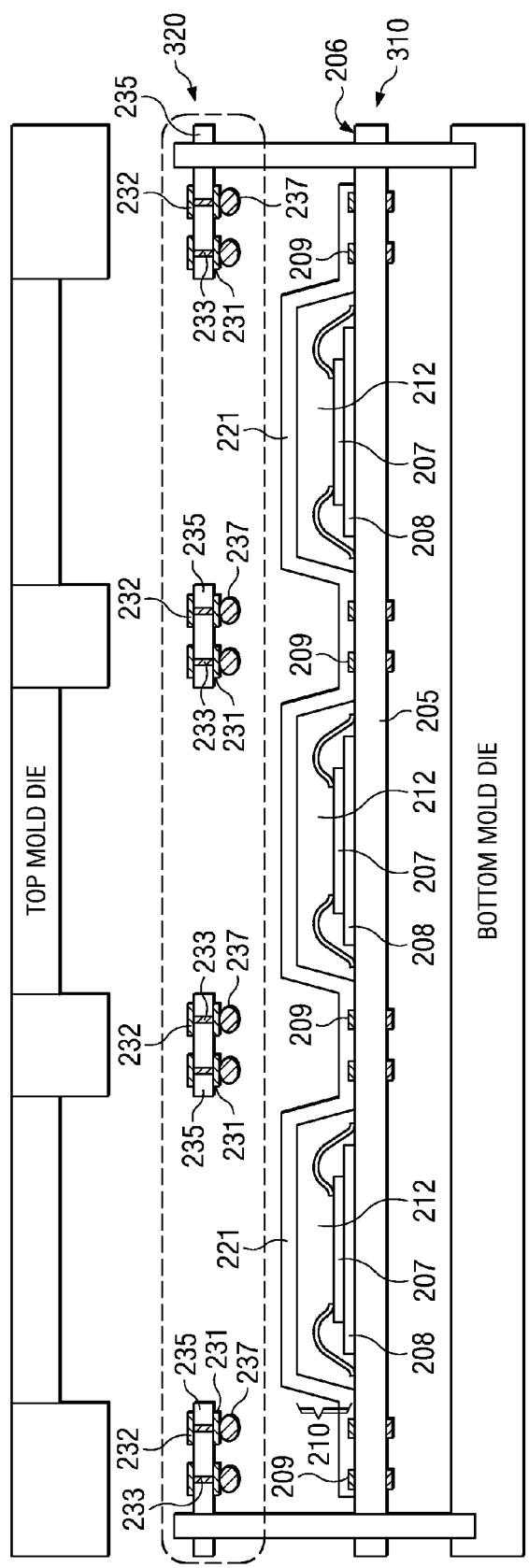

FIG. 3C depicts the placement of the molded substrate strip 310 in a bottom die tool having the interposer strip 320 above aligned to one another by pins of the die mold inserted through respective punch out holes 338 and 339, before heat pressing. FIG. 3D depicts the interposer strip 320 bonded to the molded substrate strip 310 after heat pressing. FIG. 3E depicts separate electronic assemblies adapted for bonding a top packaged IC die thereon to form a PoP device after singulation of the structure depicted in FIG. 3D.

Figure 4A:
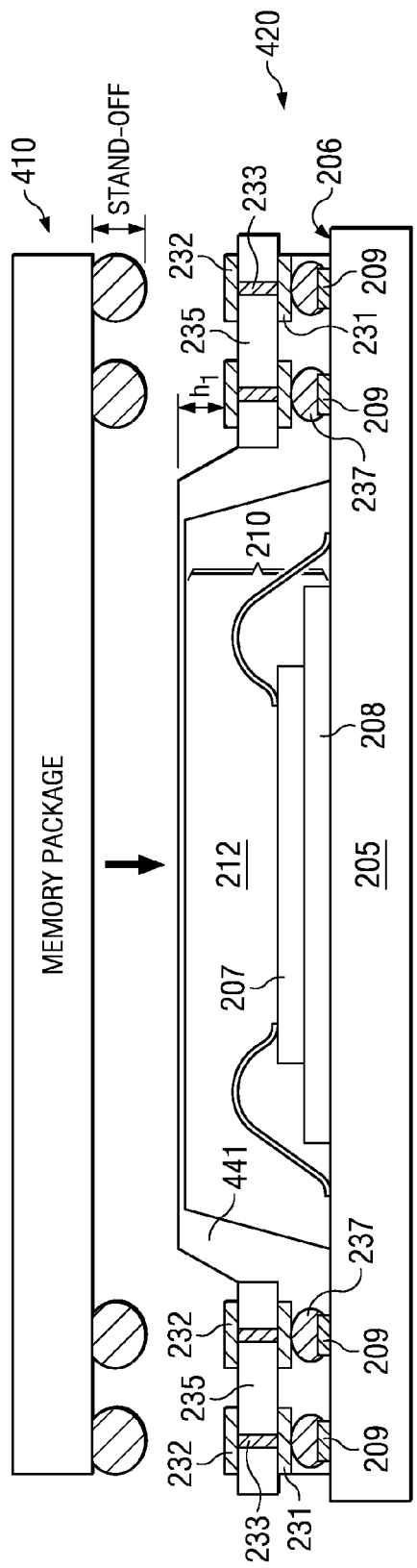

FIG. 4A depicts an exemplary top package shown as a memory package 410 exploded from an electronic assembly 420 adapted for bonding a top packaged IC die thereon to form a PoP device, according to an embodiment of the invention. In one embodiment the memory package 410 has 0.4 mm pitch pads and 0.2 mm solder stand-off. The memory package 410 or other top package is generally SMT by a customer, or by their assembly contractor or sub-contractor. The electronic assembly 420 has the same features shown in FIG. 3E and has a step height $h_1$ between the mold cap above molded IC 210 and land pads 232 on the top of the interposer of generally between 0 and 0.2 mm. To obtain a good SMT, this step height is generally between 0 and 0.15 mm for a 0.4 mm pitch and a 0.2 mm stand-off for the memory package 410 or other top packaged IC.

Figure 4B:
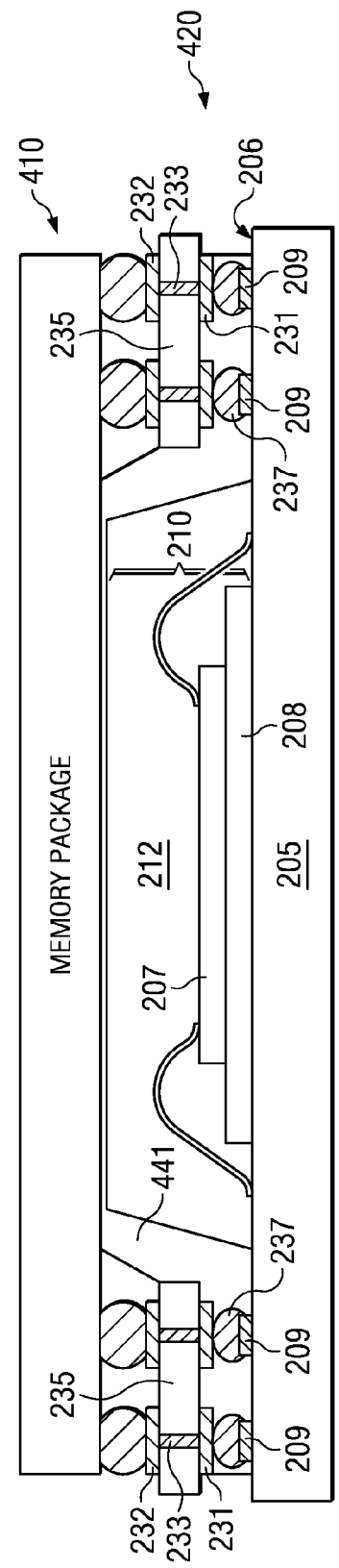
FIG. 4B depicts a POP device comprising the memory package surface following assembly mounted (SMT) to the electronic assembly, according to embodiments of the invention.

FIG. 4B depicts a POP device 450 comprising a top package shown as a memory package 410 mounted on electronic assembly 420, according to an embodiment of the invention. Underfill layer 441 can be seen to be between the top surface 206 of the substrate 205 and the bottom side of the interposer substrate 235.

The step height between the mold cap and land pads 232 on the top of the interposer allow the solder balls of the memory package 410 to be mounted below a level of the mold cap. This feature minimizes the total height of POP device 450, and reduces the thickness of the interposer substrate, such as compared to an embodiment in which the land pads on the top of the interposer are essentially planar with the mold cap height. As described above, to obtain the desired step height, the thickness of the interposer can be selected, such as to obtain a small positive step height between mold top and the land pads 232 on the interposer substrate surface.

For example, for a top packaged IC having a land pad pitch of 0.5 mm±10%, the interposer thickness can be selected so that the step height is between 0 to 0.2 mm. In another embodiment, for a top packaged IC having a land pad pitch of 0.4 mm±10%, the interposer thickness can be selected so that the step height is between 0 to 0.15 mm. In yet another embodiment, for a top packaged IC having a land pad pitch of ≦0.33 mm, the interposer thickness can be selected so that the step height is between 0 to 0.1 mm.

While various embodiments of the present invention have been described above, it should be understood that they have been presented by way of example only, and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

Although the discussed embodiments have been illustrated and described with respect to one or more implementations, equivalent alterations and modifications will occur to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

The invention claimed is:

1. An electronic assembly adapted for bonding top packaged ICs thereon to form a package on package (PoP) device, comprising:
   a bottom package substrate having a substrate top surface and a molded IC die bonded thereto, said molded IC die defining a mold cap height, said substrate top surface having substrate contact pads lateral to said molded IC die;
   an interposer substrate having bottom metal land pads on a bottom side of said interposer substrate and top metal land pads on a top side of said interposer substrate, interposer vias for connecting said top metal land pads to said bottom metal land pads, and an open receptacle region formed through said interposer substrate;
   wherein said substrate top surface is positioned relative to said interposer so that said molded IC die is within said open receptacle region to align said bottom metal land pads and said substrate contact pads, and
   an underfill layer between said substrate top surface and said bottom side of said interposer substrate, wherein a step height comprising said mold cap height minus a height of said top metal land pads is between minus 0.1 mm and plus 0.2 mm.

2. The electronic assembly of claim 1, wherein said step height is between 0 and 0.2 mm.

3. The electronic assembly of claim 1, wherein said bottom package substrate comprises a substantially planar laminate substrate.

4. The electronic assembly of claim 3, wherein said molded IC die comprises a second IC die stacked on a first IC die.

5. The electronic assembly of claim 1, further comprising a top packaged IC having a land pad pitch of 0.5 mm±10% mounted on said electronic assembly, and wherein said step height is between 0 to 0.2 mm.

6. The electronic assembly of claim 1, further comprising a top packaged IC having a land pad pitch of 0.4 mm±10% mounted on said electronic assembly, and wherein said step height is between 0 to 0.15 mm.

7. The electronic assembly of claim 1, further comprising a top packaged IC having a land pad pitch of less than or equal to 0.33 mm mounted on said electronic assembly, and wherein said step height is between 0 to 0.1 mm.

8. A package on package (PoP) device, comprising an interposer substrate between a bottom package substrate and a top package substrate, comprising:
   an IC die bonded to a top surface of the bottom package substrate and molded with a molding material;
   the bottom package substrate having the top surface with contact pads lateral to said molded IC die;
   the interposer substrate having top metal land pads and bottom metal land pads connected by vias positioned relative to said molded IC die to align the bottom metal land pads of the interposer substrate and the contact pads on the top side of said bottom substrate, where the top metal land pads and bottom metal land pads and the vias of said interposer substrate forming rings around the molded IC die; and
   the top package substrate having a bottom surface with contact pads positioned relative to said molded IC die to align the bottom metal land pads of the interposer substrate and the contact pads on the bottom side of said top substrate.

9. The PoP device of claim 8, further comprising a second IC die affixed on the top package substrate.

10. The PoP device of claim 8, in which the molding material has a mold cap height and the interposer substrate has an interposer thickness, which is less than the mold cap height by less than 0.2 mm.

11. The PoP device of claim 8, in which the top surface of the interposer is closer to the bottom surface of the top substrate than the molding material is to the bottom surface of the top substrate.

* * * * *